(12) United States Patent
Guo et al.

(10) Patent No.: US 12,456,989 B2
(45) Date of Patent: Oct. 28, 2025

(54) NESTED DELTA-SIGMA ANALOG-TO-DIGITAL CONVERSION SYSTEM AND METHOD

(71) Applicant: SHANGHAI JIAO TONG UNIVERSITY, Shanghai (CN)

(72) Inventors: Yuekang Guo, Shanghai (CN); Jing Jin, Shanghai (CN); Xiaoming Liu, Shanghai (CN); Jianjun Zhou, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 107 days.

(21) Appl. No.: 18/433,541

(22) Filed: Feb. 6, 2024

(65) Prior Publication Data
US 2024/0178859 A1 May 30, 2024

(30) Foreign Application Priority Data
Mar. 17, 2023 (CN) .......................... 202310266590.1

(51) Int. Cl.
*H03M 3/00* (2006.01)
(52) U.S. Cl.
CPC ............. *H03M 3/49* (2013.01); *H03M 3/464* (2013.01)
(58) Field of Classification Search
CPC ................................ H03M 3/49; H03M 3/464
USPC ........................................................ 341/126
See application file for complete search history.

(56) References Cited

U.S. PATENT DOCUMENTS

| | | | | |
|---|---|---|---|---|
| 5,162,799 A * | 11/1992 | Tanimoto | ................ | H03M 3/42 341/163 |
| 6,885,326 B2 * | 4/2005 | Zierhofer | ............... | H03M 3/482 341/143 |
| 6,930,624 B2 * | 8/2005 | Hezar | .................... | H03M 3/322 341/143 |
| 6,967,608 B1 * | 11/2005 | Maloberti | ............. | H03M 3/388 341/143 |
| 7,420,494 B1 * | 9/2008 | Schreier | .................. | H03M 3/42 341/143 |
| 9,225,349 B2 * | 12/2015 | Bourdi | ................... | H03L 7/1978 |
| 9,509,326 B1 * | 11/2016 | Kauffman | ........... | H03M 1/1009 |
| 9,680,496 B2 * | 6/2017 | Kauffman | ............... | H03M 1/46 |
| 11,043,960 B2 * | 6/2021 | Bal | ........................ | H03M 3/466 |
| 11,152,951 B2 * | 10/2021 | Tripathi | .............. | H03F 3/45475 |
| 11,394,395 B1 * | 7/2022 | Zhang | ................... | H03M 3/424 |

(Continued)

*Primary Examiner* — Zhen Y Wu
(74) *Attorney, Agent, or Firm* — CBM PATENT CONSULTING, LLC

(57) ABSTRACT

A nested Δ-Σ analog-to-digital conversion system and method, compromising: an analog filter, an analog comparator, a first feedback digital-to-analog converter (DAC), a second feedback DAC placed in front of the first feedback DAC, and a digital filter and an MSB quantizer placed at the output of the analog comparator; wherein the input of the first feedback DAC is connected to the output of the analog comparator; the analog filter, the analog comparator, and the first feedback DAC form an internal analog Δ-Σ loop; the input of the second feedback DAC is connected to the output of the MSB quantizer; the output of the second feedback DAC is connected to the output of the first feedback DAC and to the input of the analog filter; and the second feedback DAC, the internal analog Δ-Σ loop, the digital filter, and the MSB quantizer form an external hybrid Δ-Σ loop.

8 Claims, 3 Drawing Sheets

(56) References Cited

U.S. PATENT DOCUMENTS

| | | | | |
|---|---|---|---|---|
| 2003/0184463 A1* | 10/2003 | Zierhofer | H03M 3/482 | 341/143 |
| 2005/0093726 A1* | 5/2005 | Hezar | H03M 3/412 | 341/143 |
| 2007/0188362 A1* | 8/2007 | Doerrer | H03M 3/338 | 341/143 |
| 2008/0272946 A1* | 11/2008 | Melanson | H02M 1/4225 | 341/172 |
| 2011/0050471 A1* | 3/2011 | Kumar | H03M 3/368 | 341/143 |
| 2015/0042496 A1* | 2/2015 | Straeussnigg | H04R 3/00 | 341/118 |
| 2017/0288693 A1* | 10/2017 | Kumar | H03M 3/468 | |
| 2019/0199368 A1* | 6/2019 | Weng | H03M 3/454 | |
| 2019/0253069 A1* | 8/2019 | Kim | H03M 3/496 | |
| 2019/0363730 A1* | 11/2019 | Erol | H03M 1/0665 | |
| 2023/0208436 A1* | 6/2023 | Ohara | H03M 3/394 | 341/143 |
| 2024/0063812 A1* | 2/2024 | Abdelaal | H03M 3/422 | |

* cited by examiner

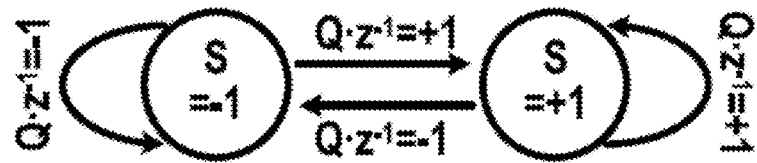
Fig. 4A
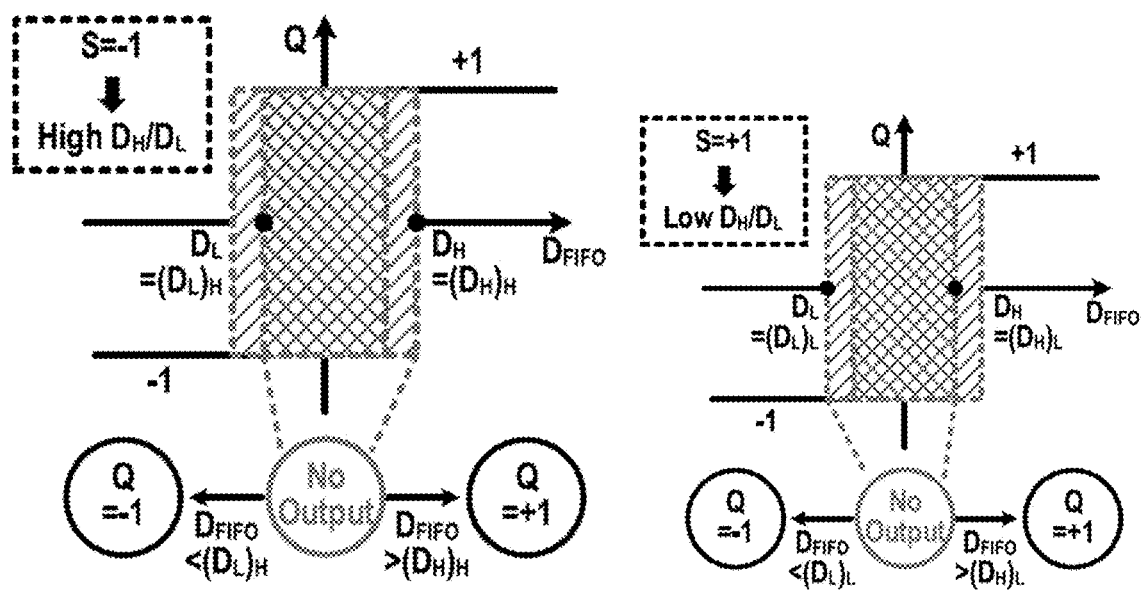
Fig. 4B
Fig. 4C

NESTED DELTA-SIGMA ANALOG-TO-DIGITAL CONVERSION SYSTEM AND METHOD

CROSS-REFERENCE TO RELATED APPLICATIONS

This application claims priority to Chinese Patent Application Ser. No. CN202310266590.1 filed on 17 Mar. 2023.

TECHNICAL FIELD

The present invention relates to a technique in the field of signal processing, specifically a nested Δ-Σ analog-to-digital conversion system and method.

BACKGROUND TECHNOLOGY

Existing zoom Δ-Σ analog-to-digital conversion techniques pre-quantize an analog input signal through a coarse quantizer, allowing an analog Δ-Σ loop to process only a small portion of the analog signal, thereby reducing the difficulty of designing a Δ-Σ loop. Nevertheless, the zoom Δ-Σ analog-to-digital converter suffers from spurious leakage and level mismatch problems between coarse and fine quantization that limit the accuracy of the Δ-Σ analog-to-digital converter, i.e., the fine quantization Δ-Σ analog-to-digital converter's signal transfer function is not equal to 1, and the final output result is affected by that function and suffers from leakage problems, and there is spuriousness in the frequency spectrum of the output signal, limiting the analog-to-digital converter's accuracy. In addition, the outputs of the coarse-quantization and the fine-quantization analog-to-digital converters are all fed back through a digital-to-analog converter to the input of the analog-to-digital converter. Thus, the mismatch between the level of the most significant bit (MSB) generated by coarse quantization and the level of the least significant bit (LSB) generated by fine quantization will lead to an increase in the internal signal amplitude of fine quantization Δ-Σ analog-to-digital converter, which will deteriorate the performance of the analog-to-digital converter.

SUMMARY OF THE INVENTION

The present invention proposes a nested Δ-Σ analog-to-digital conversion system and method for the above deficiencies in the prior art. By means of a nested external digital-to-analog external hybrid Δ-Σ loop, the signal swing of an internal analog Δ-Σ loop is dynamically adjusted, which can reduce the difficulty in designing the internal analog Δ-Σ loop, and significantly improve the energy efficiency and accuracy.

The present invention is realized by the following technical solutions:

The present invention relates to a nested Δ-Σ analog-to-digital conversion system comprising: an analog filter, an analog comparator, a first feedback digital-to-analog converter (DAC), a second feedback digital-to-analog converter placed in front of the first feedback digital-to-analog converter, and a digital filter and an MSB quantizer placed at the output of the analog comparator, which are sequentially connected. Wherein the input of the first feedback digital-to-analog converter is connected to the output of the analog comparator; the analog filter, the analog comparator, and the first feedback digital-to-analog converter form an internal analog Δ-Σ loop; the input of the second feedback digital-to-analog converter is connected to the output of the MSB quantizer; the output of the second feedback digital-to-analog converter is connected to the output of the first feedback digital-to-analog converter and to the input of the analog filter; and the second feedback digital-to-analog converter, the internal analog Δ-Σ loop, the digital filter, and the MSB quantizer form an external hybrid Δ-Σ loop.

Technical Effects

The present invention significantly reduces the signal swing within the analog Δ-Σ loop through a nested architecture and improves the energy efficiency of the analog-to-digital converter; there are no spurious leakage and level mismatch problems, so that it is characterized by high accuracy; all circuits other than the analog Δ-Σ loop are digital circuits, thus it has a high degree of affinity for digital circuits and design flexibility.

BRIEF DESCRIPTION OF THE DRAWINGS

FIG. 4A shows a schematic diagram of an MSB quantization method based on hysteresis comparison: prior to MSB quantization, set the indicator variable S to the polarity of the previous tri-state comparator output result;

FIG. 4B shows a schematic diagram of an MSB quantization method based on hysteresis comparison: dynamically updating the high thresholds $D_H$ and $D_L$ of the tri-state comparator according to the indication variable S;

FIG. 4C shows a schematic diagram of an MSB quantization method based on hysteresis comparison: dynamically updating the low thresholds $D_H$ and $D_L$ of the tri-state comparator according to the indication variable S;

DETAILED DESCRIPTION OF THE INVENTION

Figure 1:
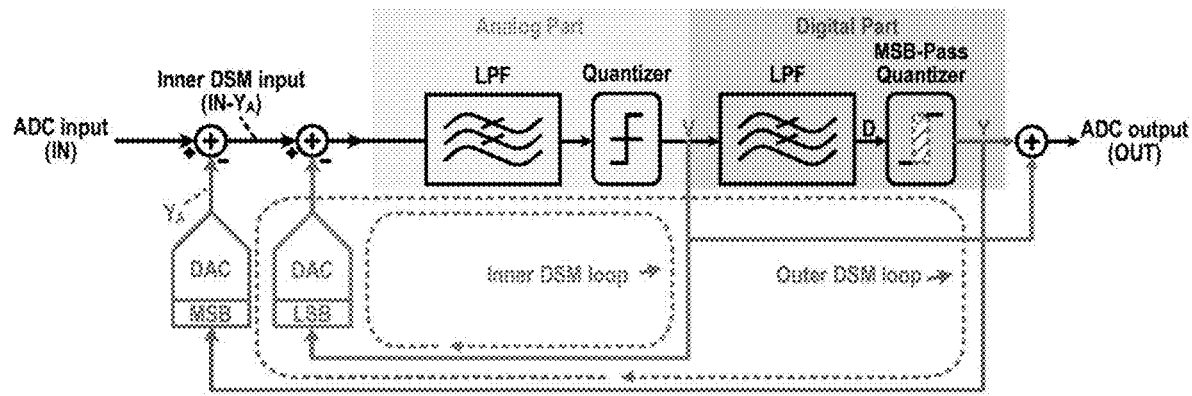
FIG. 1 shows a schematic diagram of the system of the present invention.

As shown in FIG. 1, the implementation relates to a nested Δ-Σ analog-to-digital conversion system, comprising: an analog filter, an analog comparator, a first feedback digital-to-analog converter, a second feedback digital-to-analog converter DAC-MSB placed in front of the first feedback digital-to-analog converter DAC-LSB, and a digital filter and an MSB quantizer placed at the output of the analog comparator, which are sequentially connected. Wherein the input of the first feedback digital-to-analog converter is connected to the output of the analog comparator; the analog filter, the analog comparator, and the first feedback digital-to-analog converter form an internal analog Δ-Σ loop; the input of the second feedback digital-to-analog converter is connected to the output of the MSB quantizer; the difference between the analog quantity $Y_A$, which corresponds to the output signal Y of the external mixed Δ-Σ loop at the output of the second feedback digital-to-analog converter, and the input signal IN is derived, and the difference between $IN-Y_A$ and the output of the first feedback digital-to-analog converter is further used as an input to the analog filter; together, the second feedback digital-to-analog converter, the internal analog Δ-Σ loop, the digital filter, and the MSB quantizer form an external hybrid Δ-Σ loop.

Figure 2:
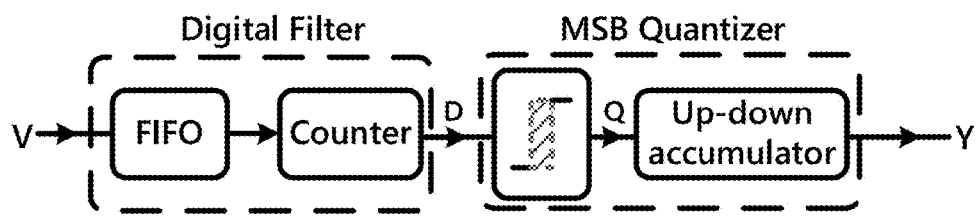
FIG. 2 shows a schematic diagram of the implementation method of a low latency MSB quantization.

As shown in FIG. 2, the described digital filter comprises: a first-in-first-out memory (FIFO) with a counter.

As shown in FIG. 2, the described MSB quantizer includes: a tri-state digital comparator and an up-down accumulator.

Figure 3:
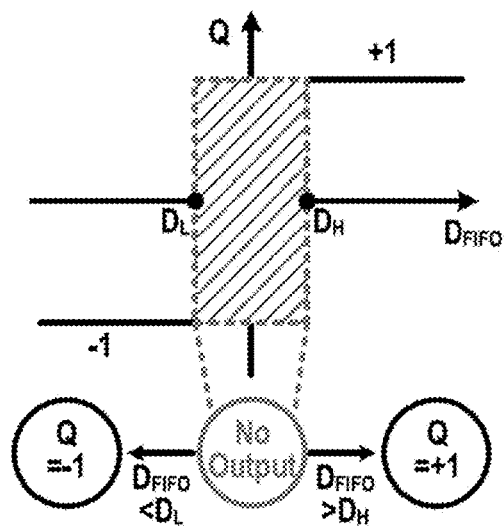
FIG. 3 shows a schematic diagram of the input-output transfer characteristics of a tri-state comparator with no hysteresis comparison.
Figure 5:
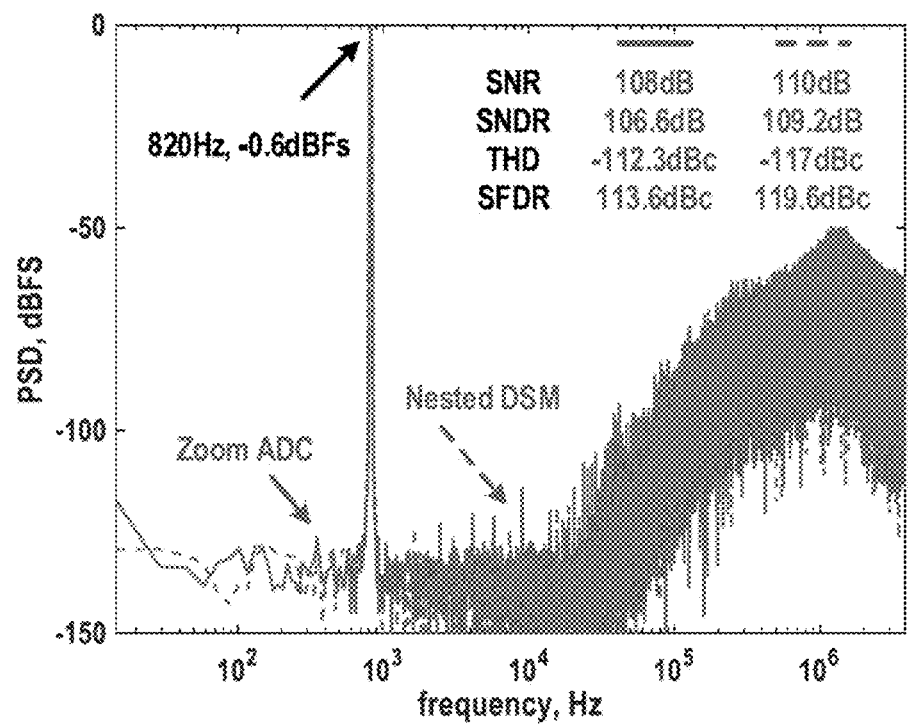
FIG. 5 shows a schematic diagram comparing the spectrums of a zoom Δ-Σ ADC versus a nested Δ-Σ ADC.
Figure 6:
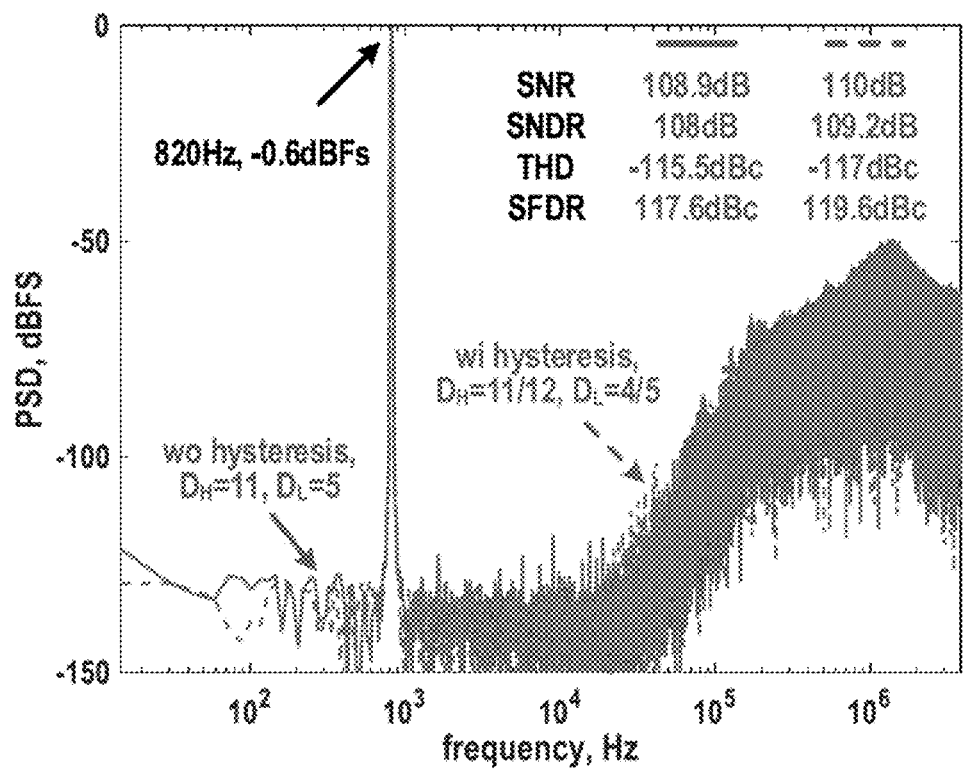
FIG. 6 shows a schematic diagram comparing the spectrums with/without hysteresis comparison.

As shown in FIG. 3, the described operating state of the tri-state digital comparator comprises: when the input D of the tri-state digital comparator is greater than the comparison threshold $D_H$, the tri-state digital comparator outputs+1; when the input D of the tri-state digital comparator is less than the comparison threshold $D_L$, the tri-state digital comparator outputs−1; and when the input D of the tri-state digital comparator is between $D_L$ and $D_H$, the tri-state comparator does not produce an output result.

The described internal analog Δ-Σ loop quantizes the input difference IN−YA and outputs a signal V=STF*(IN−YA), wherein STF is a signal transfer function of the internal analog Δ-Σ loop. Due to the high gain characteristics of the digital filter, the input of the digital filter, i.e., the output of the internal analog Δ-Σ loop, is a virtual ground terminal, and the output signal V of the internal analog Δ-Σ loop has only two states of signals, '0' and '1'. When the output signal V deviates from the mean value ½, the MSB quantizer will detect the deviation. More specifically, when the mean value of the output signal V is higher than $D_H$/lower than $D_L$, the MSB quantizer will increase/decrease the YA in order to decrease/increase (IN−$Y_A$), forcing the mean value of V back to ½. Only when the change in the mean value of the output signal V is sufficiently large and outside the range of ($D_L$, $D_H$) can a change in the output of the MSB quantizer be caused, wherein $D_H$ and $D_L$ are the high and low thresholds, respectively, of the tri-state comparator of the MSB quantizer.

Thus the MSB quantizer quantizes only the MSB, and throughout the nested Δ-Σ analog-to-digital converter, the internal analog Δ-Σ loop quantizes and feeds back the LSB, and the external hybrid Δ-Σ loop is responsible for quantizing and feeding back the MSB.

The output signals of the described external hybrid $$\Delta - \sum \text{loop } Y = \frac{IN \times STF \times LPF_{DIG} + E_Q \times NTF \times LPF_{DIG} + E_Y}{STF \times LPF_{DIG} + 1},$$

Wherein: IN is the input of the nested Δ-Σ analog-to-digital conversion system, i.e., the input analog signal of the external hybrid Δ-Σ loop; V is the output signal of the internal analog Δ-Σ loop, LPFDIG is the transfer function of the digital filter; EY is the quantization noise in the quantization process of the MSB; EQ is the quantization noise of the internal analog Δ-Σ loop; NTF is the noise transfer function of the internal analog Δ-Σ loop; and STF is the signal transfer function of the internal analog Δ-Σ loop.

The quantization noise $E_Q$ of the described internal analog Δ-Σ loop herein acts as a perturbation signal to break the signal correlation characteristics due to low accuracy during MSB quantization, thereby eliminating the signal correlation spuriousness, and avoiding the problem that the error in the coarse quantization stage of the existing zoom Δ-Σ analog-to-digital conversion technique contains a large amount of spurious leakage.

The input signal of the described MSB quantizer in an MSB quantization cycle is limited to the MSB judgment range, specifically: D=Σ(STF×(IN−$Y_A$)+$E_Q$×NTF)∈ ($D_L$, $D_H$), wherein Σ denotes the summation filtering process of the digital filter and ($D_L$, $D_H$) is the judgment interval of the MSB quantizer.

Since the portion of the signal outside the ($D_L$, $D_H$) interval is suppressed by the external hybrid Δ-Σ loop and does not appear in the internal analog Δ-Σ loop, the signal swing of the internal analog Δ-Σ loop is dependent on ($D_L$, $D_H$) and is not subject to the mismatch problem.

As shown in FIG. 2, this implementation relates to a low-latency MSB quantization method based on the above-described analog-to-digital conversion system, comprising computer readable medium operable on a computer with memory for the low-latency MSB quantization method, and comprising program instructions for executing the following steps:

Step 1: A digital filter filters the analog Δ-Σ loop output V to obtain the output signal D. The FIFO in the digital filter stores the data of the most recent H cycles of V. The counter in the digital filter counts the H data in the FIFO, and the counting result D is the output of the digital filter.

Step 2: the tri-state comparator in the MSB quantizer compares D to the thresholds $D_L$, $D_H$, and the tri-state comparator outputs +1 or −1 or no outputs.

Step 3: The up-down accumulator accumulates the tri-state comparator output, and when the tri-state comparator output is +1, the up-down accumulator output is plus 1; when the tri-state comparator output is −1, the up-down accumulator output is minus 1; and when the tri-state comparator does not produce an output, the up-down accumulator output is unchanged.

Step 4: improving an energy efficiency and accuracy of an analog-to-digital converter based the results of the low-latency MSB quantization method.

The output of the described up-down accumulator, i.e., the quantization output result of the MSB quantizer, is that during the MSB quantization process, although the MSB quantizer can produce multiple bits of data, each quantization only changes the data accumulated by the accumulator by +1 or −1 compared to the previous quantization of the MSB. All the information of the MSB does not need to be derived in a single MSB quantization, and only the information of the lowest bit in the MSB needs to be derived in a single MSB quantization, thus characterized by low latency.

FIG. 3 shows the input-output transfer characteristics of a tri-state comparator without hysteresis, i.e., the thresholds for the MSB comparisons in step 2 are always fixed $D_L$ and $D_H$, which makes it difficult to trade-off accuracy and speed for the analog-to-digital converter. When a sine wave is input to the analog-to-digital converter, $D_L$ needs to be relatively large and $D_H$ needs to be relatively small to ensure that the MSB quantizer can follow the change of the sine wave zero-crossing point. Nonetheless, $D_L$ needs to be relatively small and $D_H$ needs to be relatively large to ensure that the MSB quantizer can quantize sinusoidal peaks and valleys without generating bit errors.

As shown in FIG. 4A-FIG. 4C, a threshold optimization method for the tri-state comparator in the MSB quantizer in step 2 above, comprising:

Step a: Prior to MSB quantization, set the indicator variable S to the polarity of the previous tri-state comparator output result, as shown in FIG. 4A.

Step b: Dynamically updating the high and low thresholds $D_H$ and $D_L$ of the tri-state comparator according to the indication variable S, as shown in FIG. 4B-FIG. 4C, as follows: pre-setting the upper and lower limits of the ranges of the high and low thresholds $(D_H)_H$, $(D_H)_L$ and $(D_L)_H$, $(D_L)_L$, and, when S is +1, setting the high and low thresholds $D_H$ and $D_L$ of the tri-state comparator to $(D_H)_L$ and $(D_L)_L$, otherwise it is set to $(D_H)_H$ and $(D_L)_H$.

Step c: Perform a comparison with the tri-state comparators in the MSB quantization process based on the updated high and low thresholds of the tri-state comparators.

MSB quantization method based on hysteresis comparison: The hysteresis comparison controls the selection of the MSB comparison threshold through the indicator variable S. The hysteresis comparison allows the thresholds to be dynamically adjusted in real time, thus allowing the analog-to-digital converter to accommodate both accuracy and speed. For example, when S is +1, when 1) the signal processed by the analog-to-digital converter is rising, i.e., the mean value of V will be increasing, so the threshold for comparison during MSB quantization is $D_H$, and the hysteresis comparison mechanism sets $D_H$ to $(D_H)_L$. As a result, the MSB quantizer can follow the rapid change of the input signal. When 2) the signal processed by the analog-to-digital converter is at the peak of the wave, the mean value of V tends to decrease, so the threshold for comparison during MSB quantization is $D_L$, and the hysteresis comparison mechanism sets $D_L$ to $(D_L)_L$.

MSB quantization does not generate error codes.

After specific practical experiments, the chip was tested and verified at 180 nm CMOS process. The clock frequency is 7.68 MHz and the input signal is a −0.6 dBFs and 820 Hz sine wave. FIG. 4 compares the spectra of zoom Δ-Σ analog-to-digital converter and nested Δ-Σ analog-to-digital converter. Since nested Δ-Σ analog-to-digital converter is exempted from spurious leakage problems and level mismatch problems, the nested Δ-Σ analog-to-digital converter achieves higher signal-to-noise-distortion ratio (SNDR) and spurious-free dynamic range (SFDR).

Compared with the prior art, the present system, through the closed-loop feedback control of the external hybrid Δ-Σ loop, $Y_A$ converges to IN, so that the amplitude of (IN−$Y_A$) is only a small fraction of the amplitude of IN. The difficulty of designing the internal analog Δ-Σ loop can be greatly alleviated, and high performance can be achieved even with the low-power internal analog Δ-Σ loop, which is characterized by high energy efficiency. Secondly, the problem of spurious leakage and the problem of MSB and LSB level mismatch do not exist in the nested Δ-Σ analog-to-digital converter of the present invention, while all modules are digital circuits except for the analog Δ-Σ loop, which provides a high degree of flexibility and affinity for digital circuits.

The above specific embodiments may be locally adjusted in different ways by those skilled in the art without departing from the principles and purposes of the present invention, and the scope of protection of the present invention is governed by the claims and is not limited by the above specific embodiments, and each of the embodiments within the scope thereof is subject to the present invention.

What is claimed is:

1. A nested Δ-Σ analog-to-digital conversion system comprises: an analog filter, an analog comparator, a first feedback digital-to-analog converter (DAC), a second feedback digital-to-analog converter placed in front of the first feedback digital-to-analog converter, and a digital filter and a most significant bit (MSB) quantizer placed at an output of the analog comparator, which are sequentially connected, and wherein an input of the first feedback digital-to-analog converter is connected to the output of the analog comparator; the analog filter, the analog comparator, and the first feedback digital-to-analog converter form an internal analog Δ-Σ loop; an input of the second feedback digital-to-analog converter is connected to an output of the MSB quantizer; an output of the second feedback digital-to-analog converter is connected to an output of the first feedback digital-to-analog converter and to an input of the analog filter; and the second feedback digital-to-analog converter, the internal analog Δ-Σ loop, the digital filter, and the MSB quantizer form an external hybrid Δ-Σ loop.

2. The nested Δ-Σ analog-to-digital conversion system according to claim 1, characterized in that the MSB quantizer comprises: a tri-state digital comparator and an up-down accumulator.

3. The nested Δ-Σ analog-to-digital conversion system according to claim 2, characterized in that operating states of the tri-state digital comparator comprises: when an input D of the tri-state digital comparator, is greater than the comparison threshold $D_H$, the tri-state digital comparator outputs +1; when the input D of the tri-state digital comparator, is less than a comparison threshold $D_L$, the tri-state digital comparator outputs −1; when the input D of the tri-state digital comparator, is between $D_L$ and $D_H$, the tri-state comparator produces no output.

4. The nested Δ-Σ analog-to-digital conversion system according to claim 1, characterized in that the internal analog Δ-Σ loop quantizes an input difference (IN−YA) and outputs a signal V=STF*(IN−YA), wherein STF is a signal transfer function of the internal analog Δ-Σ loop, and due to the high gain characteristics of the digital filter, the input of the digital filter that is the output of the internal analog Δ-Σ loop, is a virtual ground terminal, and the output signal V of the internal analog Δ-Σ loop has only two states of signals, '0' and '1', and when the output signal V deviates from the mean value ½, the MSB quantizer will detect the deviation, and more specifically, when the mean value of the output signal V is higher than $D_H$/lower than $D_L$, the MSB quantizer will increase/decrease the YA in order to decrease/increase (IN-YA), forcing the mean value of V back to ½, and only when the change in the mean value of the output signal V is sufficiently large and outside the range of ($D_L$, $D_H$) can a change in the output of the MSB quantizer be caused, wherein $D_H$ and $d_L$ are the high and low thresholds, respectively, of the tri-state comparator of the MSB quantizer.

5. The nested Δ-Σ analog-to-digital conversion system according to claim 1, characterized in that output signals of the external hybrid $$\Delta - \sum \text{loop } Y = \frac{IN \times STF \times LPF_{DIG} + E_Q \times NTF \times LPF_{DIG} + E_Y}{STF \times LPF_{DIG} + 1},$$

wherein: IN is the input of the nested Δ-Σ analog-to-digital conversion system that is the input analog signal of the external hybrid Δ-Σ loop; Y is the output signal of the internal analog Δ-Σ loop, $LPF_{DIG}$ is the transfer function of the digital filter; $E_Y$ is the quantization noise in the quantization process of the MSB; $E_Q$ is the quantization noise of the internal analog Δ-Σ loop; NTF is the noise transfer function of the internal analog Δ-Σ loop; and STF is the signal transfer function of the internal analog Δ-Σ loop.

6. The nested Δ-Σ analog-to-digital conversion system according to claim 5, characterized in that the quantization noise $E_Q$ of the internal analog Δ-Σ loop herein acts as a perturbation signal to break the signal correlation characteristics due to low accuracy during MSB quantization, thereby eliminating the signal correlation spuriousness, and avoiding the problem that the error in the coarse quantization stage of the existing zoom Δ-Σ analog-to-digital conversion technique contains a large amount of spurious leakage.

7. A low-latency MSB quantization method based on the nested Δ-Σ analog-to-digital conversion system of claim 1, comprising a computer readable medium operable on a computer with memory for the low-latency MSB quantization method, and comprising program instructions for executing the following steps:

step 1: a digital filter filters the internal analog Δ-Σ loop output V to obtain the output signal D, and a first-in-first-out memory (FIFO) in the digital filter stores the data of the most recent H cycles of V, and the counter in the digital filter counts the H data in the FIFO, and the counting result D is the output of the digital filter;

step 2: a tri-state comparator in the MSB quantizer compares D to the thresholds $D_L$, $D_H$, and the tri-state comparator outputs +1 or −1 or no outputs;

step 3: an up-down accumulator accumulates the tri-state comparator output, and when the tri-state comparator output is +1, the up-down accumulator output is plus 1; when the tri-state comparator output is −1, the up-down accumulator output is minus 1; and when the tri-state comparator does not produce an output, the up-down accumulator output is unchanged;

each quantization changes only the data accumulated by the accumulator by +1 or −1 compared to the previous quantization of the MSB, and all the information of the MSB does not need to be derived in a single quantization of the MSB, but only the information of the lowest bit in the MSB needs to be derived in a single quantization of the MSB; and step 4: improving an energy efficiency and accuracy of an analog-to-digital converter based the results of the low-latency MSB quantization method.

8. The low latency MSB quantization method according to claim 7, characterized in that the threshold of the tri-state comparator is further optimized by the following steps:

step a: prior to MSB quantization, set the indicator variable S to the polarity of the previous tri-state comparator output result, step b: dynamically updating the high and low thresholds $D_H$ and $d_L$ of the tri-state comparator according to the indication variable S, as follows: pre-setting the upper and lower limits of the ranges of the high and low thresholds $(D_H)_H$, $(D_H)_L$ and $(D_L)_H$, $(D_L)_L$, and, when S is +1, setting the high and low thresholds $D_H$ and $d_L$ of the tri-state comparator to $(D_H)_L$ and $(D_L)_L$, otherwise it is set to $(D_H)_H$ and $(D_L)_H$; and step c: perform a comparison with the tri-state comparators in the MSB quantization process based on the updated high and low thresholds of the tri-state comparators.

* * * * *